United States Patent
Garlough et al.

[11] Patent Number: 6,037,020
[45] Date of Patent: *Mar. 14, 2000

[54] ULTRASONIC MIXING OF THROUGH HOLE TREATING COMPOSITIONS

[75] Inventors: Gregory Dean Garlough, Bloomington; Benjamin Todd Carroll, Brooklyn Park; Michael Val Carano, Plymouth, all of Minn.; Frank Polakovic, Ringwood, N.J.

[73] Assignee: Electrochemicals Inc., Maple Plain, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/790,294

[22] Filed: Jan. 29, 1997

Related U.S. Application Data

[63] Continuation-in-part of application No. 08/593,232, Jan. 29, 1996, abandoned.

[51] Int. Cl.⁷ ............................... B05D 5/12; B05B 1/00
[52] U.S. Cl. ..................... 427/600; 427/601; 427/97; 427/122; 205/125; 205/91; 205/148
[58] Field of Search ............................ 427/97, 98, 122, 427/600, 601; 205/91, 125, 126, 164, 167, 148

[56] References Cited

U.S. PATENT DOCUMENTS

| | | | |
|---|---|---|---|
| 2,872,391 | 2/1959 | Hauser et al. | 204/15 |
| 3,194,681 | 7/1965 | Nicholson et al. | 427/601 |
| 3,351,539 | 11/1967 | Branson | 204/14 |
| 3,807,704 | 4/1974 | Janzen et al. | 259/72 |
| 4,552,781 | 11/1985 | Cannady, Jr. et al. | 427/601 |
| 4,619,741 | 10/1986 | Minten et al. | 205/125 |
| 4,619,871 | 10/1986 | Takami | 428/607 |
| 5,139,642 | 8/1992 | Randolph et al. | 205/125 |
| 5,330,680 | 7/1994 | Sakawaki et al. | 252/309 |
| 5,389,270 | 2/1995 | Thorn et al. | 252/22 |
| 5,476,580 | 12/1995 | Thorn et al. | 205/122 |

FOREIGN PATENT DOCUMENTS 2102240  10/1992  Canada.

OTHER PUBLICATIONS

Presenting Our New In–Line Mixer–Disperser Type HED.
Kreisel et al., New Process Forces a Solution, Ultrasonics and force flooding merge to clean out small holes, Circuits Manufacturing, Jun. 1987, pp. 18–19.
Ultrasonics, Electrochemicals, A History of Innovation, pp. 1–4, no date.
J. Fuchs, Ultrasonic Cleaning, pp. 145–146, 150, 152, no date.
Lea et al., Blowholing in PTH Solder Fillets*, Part 1, Assessment of the Problem, Circuit World, vol. 12, No. 4, no month available, 1986.

(List continued on next page.)

*Primary Examiner*—Brian K. Talbot
*Attorney, Agent, or Firm*—McAndrew, Held & Malloy, Ltd.

[57] ABSTRACT

A method for treating a non-conductive through hole surface of a printed wiring board is disclosed. A printed wiring board including through holes is cleaned, conditioned, and a conductive coating is applied to the initially-nonconductive through hole by contacting it with a series of baths. The conductive coating, for example a graphite dispersion coating, facilitates later electroplating of the conductive surface. While at least partially immersing the through hole in one or more of these baths, ultrasonic energy is introduced in the bath in the vicinity of the through hole. The ultrasonic energy can be introduced during the entire immersing step, before the immersing step, or both. The ultrasonic energy reduces the formation of blowholes during later processing (and especially soldering) of the printed wiring board. The ultrasonic treatment can also improve the dispersion of the conductive particles in a conductive carbon dispersion, reduce or eliminate the formation of pinhole defects, and provide other advantages.

27 Claims, 4 Drawing Sheets

OTHER PUBLICATIONS

Howie et al. Blowholing in PTH Solder Fillets, Part 2, The Nature, Origin and Evolution of the Gas, Circuit World, vol. 12, No. 4, no month available, 1986.

Seah et al., Blowholing in PTH Solder Fillets, Part 3, Moisture and the PCB, Circuit World, vol. 12, No. 4, no month available, 1986.

Lea et al., Blowholing in PTH Solder Fillets, Part 4, The Plated Copper Barrel, Circuit World, vol. 13, No. 1, no month available, 1986.

Lea et al., Blowholing in PTH Solder Fillets, Part 5, The Role of the Electroless Copper, Circuit World, vol. 13, No. 1, no month available, 1986.

Lea et al., Blowholing in PTH Solder Fillets, Part 6, The Laminate, The Drilling and the Hole Wall Preparation, Circuit World, vol. 13, No. 1, no month available, 1986.

Lea et al., Blowholing in PTH Solder Fillets, Part 7, Optimising the Soldering, Circuit World, vol. 13, No. 2, no month available, 1987.

Lea et al., Blowholing in PTH Solder Fillets, Part 8, The Scientific Framework Leading to Recommendations for Its Elimination, Circuit World, vol. 13, No. 3, no month available, 1987.

C. Lea, The Harmfulness of Blowholes in PTH Soldered Assemblies, Circuit World, vol. 16, No. 4, no month available, 1990.

ULTRASONIC MIXING OF THROUGH HOLE TREATING COMPOSITIONS

CROSS-REFERENCE TO RELATED APPLICATIONS

The present application is a continuation in part of U.S. Ser. No. 08/593,232 ("the parent application"), filed Jan. 29, 1996, by Garlough, Carroll, and Carano, now abandoned. The parent application is hereby incorporated by reference in its entirety to provide continuity of disclosure.

STATEMENT REGARDING FEDERALLY SPONSORED RESEARCH OR DEVELOPMENT

Not Applicable.

BACKGROUND OF THE INVENTION

The present invention generally relates to a method for making an initially electrically nonconductive surface electrically conductive by cleaning and conditioning the surface and then applying an electrically conductive coating. The present invention relates more particularly to such a method for making the initially-nonconductive through hole and via walls of printed wiring boards electrically conductive, so they can be electroplated. ("Through holes" as used herein refers both to through holes and to vias.)

Conductive graphite and carbon black dispersions are used to provide a superior conductive coating on through hole walls and other nonconductive surfaces. Such dispersions, methods for using such dispersions to coat through holes, and improved printed wiring boards fabricated by using such dispersions are defined in U.S. Pat. Nos. 5,476,580 and 5,389,270, respectively issued to Thorn et al. on Feb. 14, 1995, and Dec. 19, 1995. Both patents referred to in the preceding sentence are incorporated herein by reference in their entireties. A graphite composition, cleaners, conditioners, and other materials and directions needed to practice these patents are available under the trademark SHADOW® from Electrochemicals Inc., Maple Plain, Minn. Other carbon dispersions containing carbon black or graphite are described, for example, in U.S. Pat. No. 5,139,642.

A problem with "blowholes" occasionally develops after the through hole wall has received a conductive coating, has been electroplated, and is then suddenly heated, as by contacting it with molten solder. (Soldering is carried out by coating the through hole walls and other conductive surfaces of a printed wiring board with hot, molten metal to make electrical connections by wetting and filling the spaces between the conductive through hole surfaces and the leads of electrical components which have been inserted through the through holes. A properly soldered through hole is filled with solder.)

Soldering heats the plated through hole walls very quickly. If there are any gaps or voids in the plated copper, moisture in the substrate is vaporized by the hot solder, which can blow some or all of the solder out of the hole and breach the copper layer. The result is a blowhole or a partially-filled or empty hole, any of which is counted as a soldering defect.

The problem of blowholes in through holes made electrically conductive by electroless plating, and the solution to blowholes when that technology is used, are described in a series of articles published in CIRCUIT WORLD, Vol. 12 No. 4 (1986), Vol. 13 No. 1 (1986), and Vol. 13 Nos. 2–3 (1987), under the common title, *Blowholing in PTH Solder Fillets*. A related article is C.Lea, *The Harmfulness of Blowholes in PTH Soldered Assemblies*, CIRCUIT WORLD, Vol.16, No.4, (1990). All the articles in this paragraph are incorporated herein by reference in their entirety for their discussion of blowholes in electroless copper technology.

Recently, the present inventors have discovered that blowholes can occasionally be a problem for electroplated through holes which have been made conductive by applying certain aqueous conductive-carbon-based conductive compositions. Thus, a need has arisen to solve the problem of blowholes when a carbon-based conductive coating is used to make through hole walls electrically conductive to facilitate electroplating.

Separately, printed wiring boards have been exposed to ultrasonic energy to facilitate cleaning through holes. See New Process Forces a Solution, CIRCUITS MANUFACTURING, June 1987, p. 18; F. John Fuchs, *Ultrasonic Cleaning*, p.145. These articles do not discuss blowholes.

BRIEF SUMMARY OF THE INVENTION

The invention is a method for treating a non-conductive through hole surface of a printed wiring board. The method can be used while or before making the through hole surface electrically conductive.

A printed wiring board including at least one through hole is supplied. Generally, the printed wiring board will include many through holes. At least one bath is provided to carry out at least one of the steps of conditioning and applying a conductive coating to the through hole.

The method is carried out by at least partially immersing the through hole in the bath and introducing ultrasonic energy in the bath in the vicinity of the through hole. The ultrasonic energy is introduced before the end of the immersing step. Optionally, the ultrasonic energy can be introduced during part or all of the immersing step, before the immersing step, or both.

Surprisingly, the ultrasonic treatment according to the present invention has been found effective for reducing, and in some instances substantially eliminating, the formation of blowholes. The ultrasonic treatment can also improve the dispersion of the carbon particles in the conductive carbon dispersion, reduce or eliminate the formation of pinhole defects, and provide other advantages.

BRIEF DESCRIPTION OF THE SEVERAL VIEWS OF THE DRAWING

Like reference characters in the several views indicate like or corresponding parts.

DETAILED DESCRIPTION OF THE INVENTION

Figure 1:
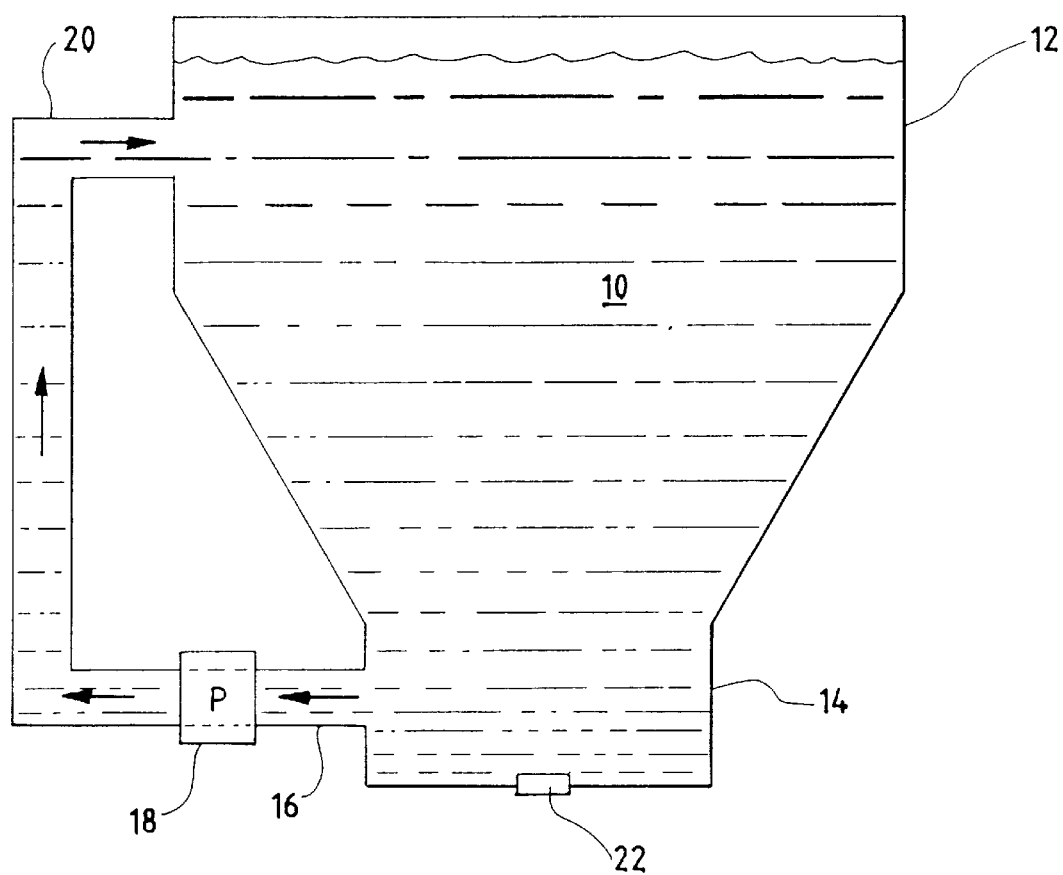
FIG. 1 is a schematic view of a recirculating bath of an aqueous carbon dispersion which is treated with ultrasonic energy.

While the invention will be described in connection with one or more preferred embodiments, it will be understood that the invention is not limited to those embodiments. On the contrary, the invention includes all alternatives, modifications, and equivalents as may be included within the spirit and scope of the appended claims.

The present invention is carried out by exposing a printed wiring board having at least one through hole to ultrasonic energy when conditioning or applying a conductive coating to the through hole. The process can be carried out during either or both of these steps. Suitable process chemicals and other supplies for carrying out this invention are sold, for example, under the registered trademark "SHADOW®" by Electrochemicals Inc., Maple Plain, Minn.

A detailed description of the SHADOW® process (and subsequent steps, such as electroplating and resistance measurement) can be found in the parent application, pages 5–46, which are incorporated by reference. A further description of one suitable process can be found in cols 5–32 of U.S. Pat. No. 5,476,580.

Descriptions of related processes which also involve cleaning, conditioning, and conductive coating steps and can be carried out according to the present invention (for two examples, the electroless copper and carbon black processes and another graphite conductive coating process) are found in cols. 1–4 of U.S. Pat. No. 5,476,580 and in U.S. Pat. No. 5,139,642, issued Aug. 18, 1992. All of the latter patent is hereby incorporated by reference herein.

The present process can be carried out in a variety of equipment. Two common types of equipment are vertical or dip process equipment, in which the cleaners, conditioners, combined cleaner/conditioners, conductive dispersions, rinses, and other chemicals are provided in stationary baths into which the vertically-disposed boards are sequentially dipped, and conveyorized or horizontal equipment in which the boards are flooded or sprayed with the respective reagents while disposed and travelling substantially horizontally. Either type of equipment, or any combination of the two types of equipment, may be used within the scope of the present invention.

A board to be processed commonly is dip-processed in the cleaning solution for 4–6 minutes at 130° to 140°0 F. (54° to 60° C.). A board is commonly cleaned in a conveyorized process by flooding it at a similar temperature for a (usually) much shorter time such as 20 to 60 seconds. These conditions may need to be modified to suit a given situation.

A board to be processed commonly is dip-processed in the conditioning dispersion for 4–6 minutes at 130° to 140° F. (54° to 60° C.). A board is commonly conditioned in a conveyorized process by flooding it at a similar temperature for a (usually) much shorter time such as 20 to 60 seconds. These conditions may need to be modified to suit a given situation.

As an alternative to separate cleaning and/or conditioning steps, these two steps can be combined into one by consolidating their respective ingredients into a single formulation which both cleans and conditions the substrates. A typical cleaner/conditioner is used in the same manner, for about the same treatment time, at about the same treatment temperature, as an independent cleaner or conditioner.

Other steps, such as rinsing, may be interposed between the previously-described steps at appropriate times.

Before or while the cleaning, conditioning, and conductive-material-depositing baths are used, at least one of them is subjected to ultrasonic energy.

Ultrasonic energy is applied in various ways, within the scope of the present invention. The process is illustrated by FIG. 1, which is a schematic view of a bath of the present dispersion which is both mixed and subjected to ultrasonic energy while in use.

Referring to FIG. 1, a bath 10 of a carbon dispersion is supported in a tank 12 which has a sump 14. The bath 10 is recirculated by periodically or (preferably) continuously withdrawing the bath 10 from the sump 14 through a conduit 16, using a pump 18, which may be either a conventional low-shear pump or a high-shear pump. The pump 18 returns the recirculation stream through the conduit 20 to the bath 10. The recirculation pump 18 both keeps the bath 10 in motion (to prevent settling) and counteracts settling by mixing the bottoms of the tank 12 with a higher region of the bath 10. The parts of FIG. 1 described so far are conventional. Tanks for other treatment baths, such as a cleaner/conditioner bath, can be similarly configured.

Still referring to FIG. 1, in this embodiment, an ultrasonic transducer 22 is operatively coupled with the bath 10 to transmit ultrasonic waves into the bath 10. Depending on the arrangement and volume of the tank 12, the choice of ultrasonic conditions, the nature and composition of the bath 10, the choice (or presence or absence) of a pump 18, the presence or absence of other stirring apparatus, and other factors, one or more transducers 22 may desirably be located in the vicinity of the sump 14 or elsewhere on or in the tank 12, the conduits 16 or 20, or the pump 18.

The ultrasonic transducer 22 can be operatively coupled with the bath 10 by locating one or more transducers 22 anywhere, relative to the bath 10, which is effective to introduce ultrasonic energy into the bath 10 while it is used or before it is used for coating a non-conductive substrate. In one embodiment, the transducer can be the wall of the tank 12 itself, or can be located outside the wall and transmit energy through the wall. This arrangement has the advantage of avoiding the need for an immersible transducer. In another embodiment, the transducer 22 can be suspended directly in the bath 10.

The ultrasonic transducer 22 generates ultrasonic waves having any desired frequency, such as a frequency between about 16 kHz and about 100 kHz, alternatively a frequency between about 20 kHz and 50 kHz, alternatively a frequency of about 25–40 kHz, alternatively a frequency on the order of 28 kHz. The frequency and the amplitude or power of the ultrasonic waves produced in the bath 10 should be sufficient, under the conditions employed, to break up agglomerates or gel particles of the bath 10 to a measurable or noticeable degree which provides at least some practical benefit. For one example, ultrasonic treatment according to the present invention is occurring if turning on the ultrasonic generator provides a coating with fewer pinholes than the same apparatus provides when operated with the ultrasonic generator turned off.

While the inventors presently contemplate that a recirculation pump 18 and an ultrasonic transducer 22 will normally be used together, the inventors further contemplate that the bath 10 can be treated to keep the solid particles finely dispersed by operating an ultrasonic transducer 22 without operating a recirculation pump 18.

Some benefit can also be gained by subjecting the dispersion to high-shear mixing, whether or not an ultrasonic transducer is used too. Referring to FIG. 1, the pump 18 can be a high-shear in-line pump or mixer which is capable in itself of treatment the bath 10. An exemplary mixer contemplated to be suitable for treatment is an IKA® Works Inc. (Wilmington, N.C.) In-line Mixer-disperser Type HED.

Figure 2:
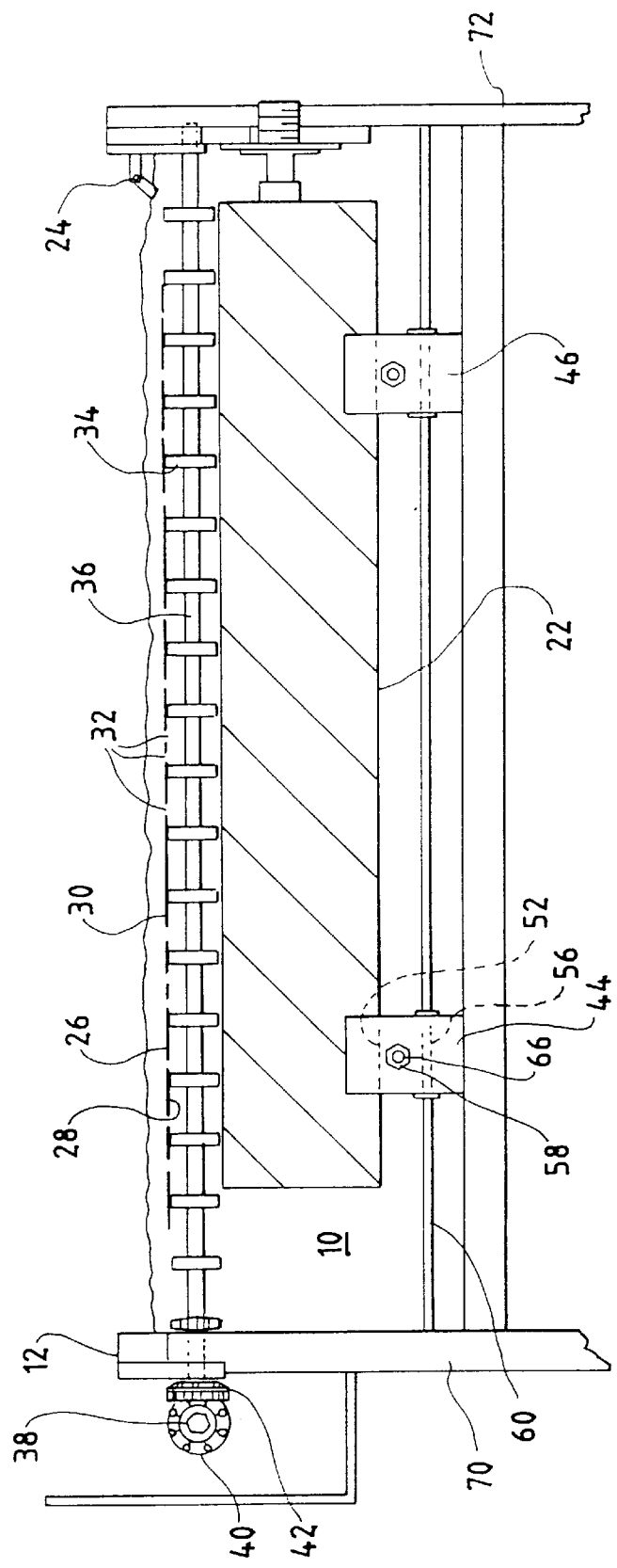
FIG. 2 is a front elevation, looking in the direction of travel of the printed wiring board, of a conveyorized process bath vessel containing an ultrasonic generator. The intervening wall of the vessel is cut away to reveal internal structure.
Figure 3:
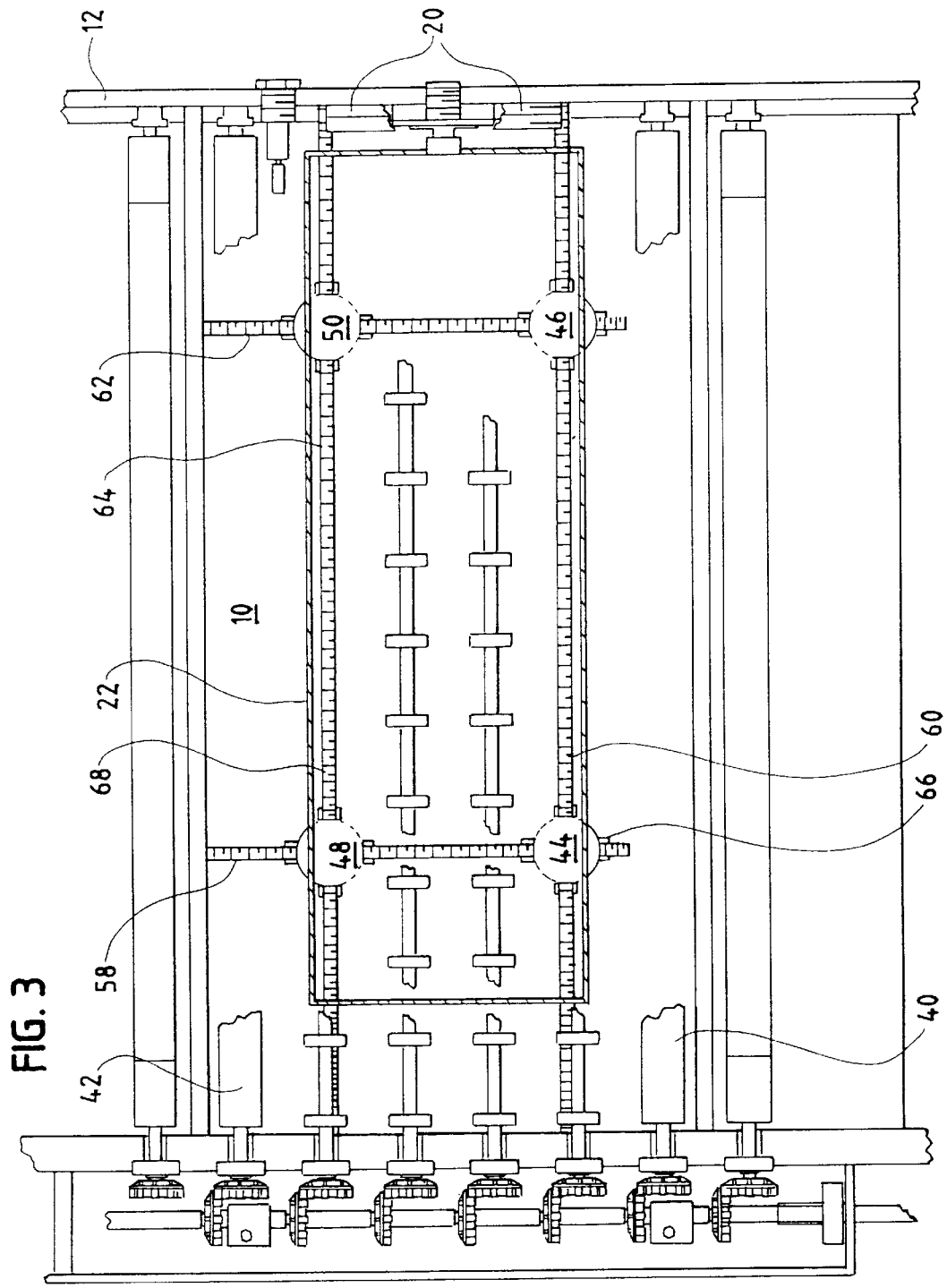
FIG. 3 is a plan view of the embodiment of FIG. 2, with the ultrasonic transducer reduced to its footprint and the overlying rollers cut away to better reveal underlying structure.

Refer now to FIGS. 2 and 3, which show conveyorized equipment for carrying out any of the cleaning, conditioning, and carbon dispersion coating steps according to the present invention. Again, a bath 10, a tank 12, flood conduits for recirculating the process bath, and a transducer 22 are shown. Like FIG. 1, the embodiment of FIGS. 2 and 3 also has a recirculation pump (not shown).

FIGS. 2 and 3 show more details of the process equipment. The level of the bath 10 is controlled by a float switch 24. Printed wiring boards such as the board 26 are provided which have first and second major surfaces 28 and 30 which are perforated by a multiplicity of through holes 32. The boards are supported in a generally horizontal position and conveyed along a path extending at least substantially parallel to their major surfaces by a series of rollers such as 34 carried on axles such as 36. The axles such as 36 are driven by a drive shaft 38 via a pair of meshed crown gears 40 and 42, respectively connected to the drive shaft 38 and the axle 36. This drive arrangement turns all of the rollers 34 at the same rate, thus smoothly immersing a series of the printed wiring boards 26 in the bath 10 and conveying them through the bath 10 just beneath its surface. Dam rollers 40 and 42 are provided near the entrance and exit to the tank 12.

Figure 4:
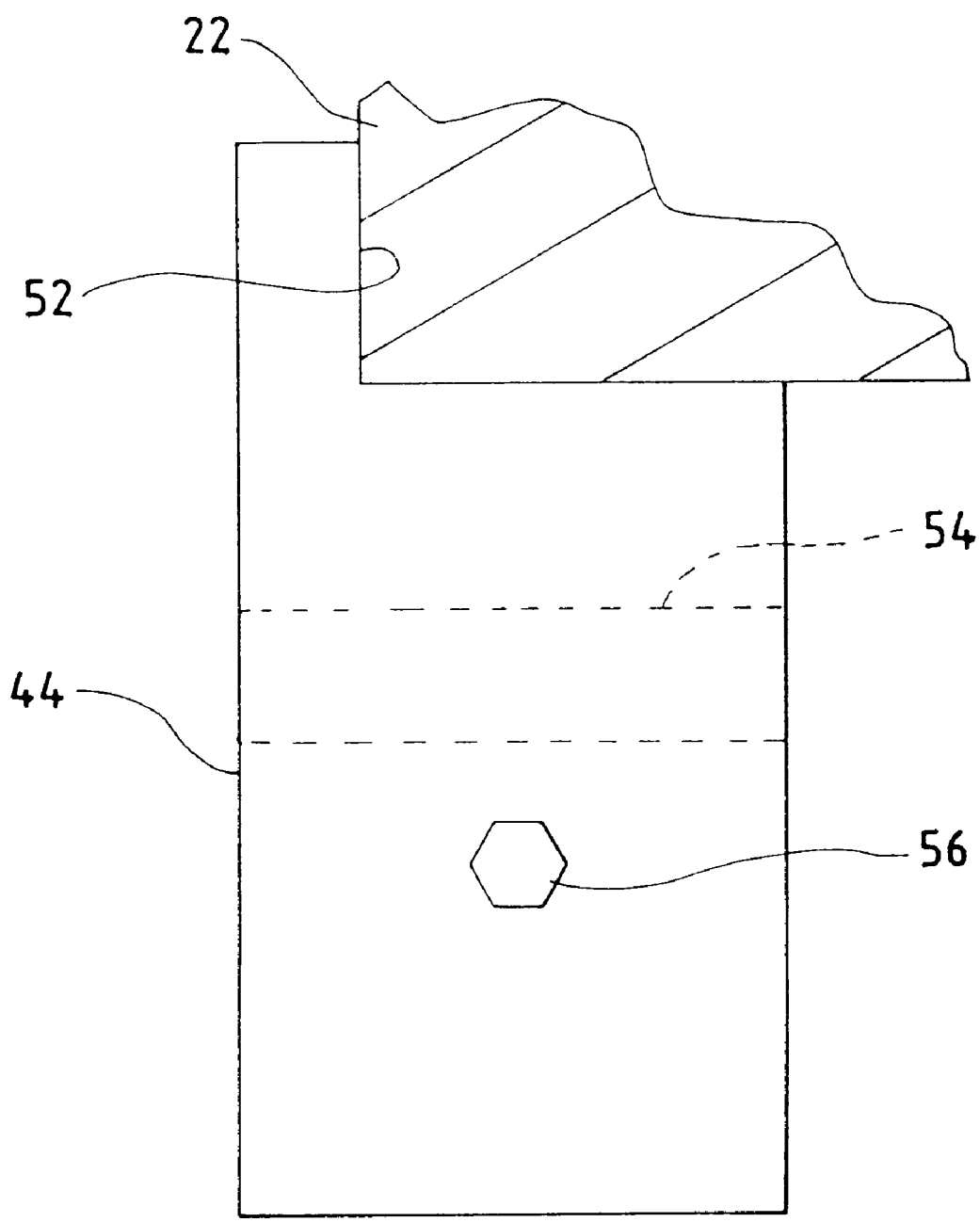
FIG. 4 is an isolated side elevation of one of the feet of FIG. 2, showing its details.

The transducer 22 is supported on polyvinyl chloride or other suitable feet 44, 46, 48, and 50 which are short cylindrical rod sections. FIG. 4 shows that each foot such as 44 has a notch 52 receiving the lower edge of the transducer 22. FIGS. 2 and 4 show that each foot such as 44 has crossed bores 54 and 56 which respectively receive a machine-direction threaded rod 58 and a transverse threaded rod 60. FIG. 3 best shows that there are two machine-direction threaded rods 58 and 62 and two transverse threaded rods 60 and 64. The threaded rods may conveniently be made of stainless steel or any other material which is compatible with the bath 10. The feet 44–50 and rods 58–64 are joined by nuts 66 threaded on the rods 58–64 and abutting the feet 44–50 to form a frame 68. FIG. 2 illustrates that the ends of the rods such as 60 may abut the side walls such as 70 and 72 to locate the frame 68 in the tank 12.

In this embodiment, the ultrasonic transducer 22 is normally completely immersed in the bath 10 during the process. The transducer 22 is located beneath the path of the printed wiring boards 26 and adjacent to the first major surfaces 28.

In this embodiment, the ultrasonic generator 22 is positioned with its exterior transducer surface (its upper surface) less than about two inches (5 cm) from the path of the printed wiring boards 26. Alternative values for this dimension are about one inch (3 cm) from the path, about 1.3 inches (3.3 cm) from the path, or about 1.25 inches (3.18 cm) from the path. ("About" as used in this specification is broadly defined to include dimensions at least one digit greater or less than the indicated value in the last significant figure, as measured in the primary unit (for distance, English units). For example, a separation between two parts of "about 2 inches" (5 cm) includes separations of from 1 to 3 inches (3 to 8 cm); "about 1 inch" includes from 0 inches (0 cm, i.e. contact) to 2 inches (5 cm); "about 1.3 inches" (3.3 cm) includes at least from 1.2 to 1.4 inches (3.0 to 3.6 cm); and "about 1.25 inches" (3.18 cm) includes at least from 1.24 inches to 1.26 inches (3.15 to 3.20 cm). In this embodiment, the ultrasonic generator 22 may directly underlie all the through holes which are to be treated, or some of the marginal through holes may be in a portion of the board 26 projecting slightly beyond the outer dimension or footprint of the ultrasonic transducer 22.

Alternatively, the transducer may be partially immersed, or the transducer 22 may be positioned above the path of the printed wiring boards 26, adjacent to their second major surfaces 30. The ultrasonic transducer 22 can be a Blackstone immersible transducer operated at a frequency of 25 kHz and a power of about 1 watt. Any other suitable transducer can instead be used.

The conveyorized horizontal apparatus of FIGS. 2–4 can also include multiple tanks 12 or other apparatus in sequence for carrying out a series of bath treatment steps on a printed wiring board 26. In this example, the indicated apparatus can be used for a cleaning/conditioning step (carried out in one bath), for a conductive colloid application step (carried out in another bath), or both. Conventionally, a rinsing step is interposed between these two process steps. Conveniently, the rinsing step may be a spray rinsing step.

Ultrasonic energy used in other cleaning baths, such as a deburring bath for removing drilling debris from through holes, may also reduce the amount of blowholing in a given installation.

WORKING EXAMPLES

The following examples are provided to describe specific embodiments of the invention and to demonstrate how it works. By providing those specific examples, the inventors do not limit the scope of the invention. The full scope of the invention is all the subject matter defined by the claims concluding this specification, and equivalents thereof.

Examples 1–4

A copper-clad printed wiring board coupon having a variety of through holes was desmeared, cleaned, and conditioned. A 500 ml working bath of Electrochemicals Inc. SHADOW® II conductive graphite aqueous dispersion was made by diluting the dispersion as sold with water to 5% solids. Example 1 was a comparative example, for which the graphite dispersion was not exposed to ultrasonic energy. The dilute graphite dispersion was coated on the printed wiring board coupon and fixed, dried, and micro-etched as recommended by Electrochemicals Inc. to prepare the coupon for electroplating. The coupon was electroplated with copper at 25 amperes per square foot (270 amperes per square meter) for ten minutes.

The coupon of Example 1 was examined by backlight testing the coupon through holes for plating defects. The plating sample was given an overall score on a scale of 1–10, with 10 representing through hole plating with no discernable defects. At the same time, the sample was evaluated directly for pinhole, small patch, and medium patch plating defects. For these evaluations, fewer defects of each kind represent better plating uniformity. The results are set out in Example 1 of Table 1.

Example 2 was carried out like Example 1, except that the diluted SHADOW® II graphite dispersion was placed in the treatment tank of a SONICOR SC-40 ultrasonic generator (obtained from Sonicor Instrument Corp., Copiague, N.Y.) and exposed to ultrasonic energy at 60 kHz, 55 watts, for five minutes. The treated dispersion was immediately applied to the coupon and the remaining steps defined in Example 1 were carried out. Example 3 was carried out like Example 2, except that the ultrasonic treatment time was increased to 15 minutes.

Example 4 was carried out in a slightly different manner. Instead of using a SHADOW® II graphite dispersion, another commercially available graphite dispersion was employed. The dispersion at 22% solids was treated with ultrasonic energy for 15 minutes in the manner described previously. After the ultrasonic treatment, the dispersion was diluted to 5% solids and then used and evaluated as described in Examples 1–3.

The results of Examples 1–4 are presented in Table 1. Looking first at Examples 1 (control—no ultrasonic treatment), 2 (5-minute ultrasonic treatment), and 3 (15-minute ultrasonic treatment), the backlight score progressively improved from 6.5 for Example 1 to 9.5 for Example 2 to 10.0—a perfect score—for Example 3. Similarly, from Example 1 to Example 3 the number of pinholes decreased dramatically, as did the numbers of small and medium patches. These results confirm the unexpected benefit, to coating uniformity, of pretreating the graphite dispersion with ultrasonic energy before using the dispersion to render through holes conductive.

The benefit of ultrasonic treatment is not lost if, after the graphite dispersions are prepared and ultrasonic energy is applied to them, the dispersions are allowed to stand for from one day up to four days or more, then retested. The disclosed ultrasonic treatment also can be used more than once to improve the coating performance of the dispersion. Repeated ultrasound treatments provide some benefit over a single treatment, particularly for reducing the number of pinholes.

Examples 5–11

Table 2 illustrates the use of ultrasonic energy in a cleaner/conditioner bath, and its effect on the number of blowholes and total defects on printed wiring board panels. The boards in question were cleaned, conditioned, coated with SHADOW® colloidal graphite, microetched, electroplated, wave soldered, and then evaluated visually for instances of solder shock and for all defects. The incidence of defects was calculated as follows. 1,000,000 was divided by the number of through holes tested for a particular example to determine the number of ppm (parts per million) of blowholes corresponding to a count of one blowhole. For example, in Example 5 reported in Table 2, 10 panels, each having 1600 holes, were tested. The total number of holes was 16,000. That number divided into one million yields 62.5, which is the number of ppm of blowholes or other defects corresponding to one defective through hole per ten of these boards. In Example 5, 11 blowholes and 133 through holes with any defect were counted. Those numbers were multiplied by 62.5 ppm per defective through hole to yield the numbers in Table 2—688 ppm of blowholes and 8313 ppm of total defects.

Examples 7, 8, and 11 are most directly comparable, as the same type of circuit board was used in each instance. These examples illustrate that the use of ultrasonic energy reduced both the frequency of blowholes and the frequency of total defects.

Example 5 is anomalous, and is not directly comparable to the other numbers in Table 2 because a different type of circuit board was used, which apparently is more prone to defects. It is believed, however, that the ultrasonic treatment reduced the number of blowholes and total defects even in Example 5, even though these defects were not eliminated in that instance. Examples 6, 9, and 10 performed on other boards illustrate the elimination of blowholes and other defects by carrying out an ultrasonic treatment.

Examples 12–16

Examples 12–16 were carried out, yielding the results reported in Table 3. In these tests 15% SHADOW® Cleaner/Conditioner III was used to clean and condition the test boards, and the ultrasonic generator was in that bath only. Commercially-available SHADOW® II graphite conductive colloid was used to impart conductivity to the boards.

Five test panels were run per test. The panels were evaluated for blowholes, partially filled holes and empty holes. The thickness of the copper plated over the graphite coating was also measured on one panel per test. Increasing the plating thickness has been one traditional method for reducing susceptibility to blowhole formation; thicker plating has been understood to inhibit the formation of blowholes.

Examples 13 and 14, which were plated at the same facility, provide the best comparison of operation with and without ultrasonic energy. The number of blowholes is much greater and the total defects are greater in Example 14, where no ultrasonic energy was applied, than in Example 13 where ultrasonic energy was applied.

Examples 12, 15, and 16, which were plated at a different facility, are also comparable. Comparing Examples 12 and 15, the total defects were not reduced significantly by the application of ultrasonic energy, but a more substantial reduction of the number of blowholes was achieved. Examples 12 and 16, both including ultrasound treatment, differ substantially, apparently because the apparatus was modified in Example 16 as indicated in Table 5. Examples 12 and 16 are another indication that the thickness of plating is not necessarily correlated with the incidence of blowholes or other soldering defects. In Example 16, the plating was thinner, and yet the incidence of defects was much lower.

Examples 17–21

Soldering defects were measured on a series of identical test panels processed in conveyorized horizontal process apparatus. "Cleaner/conditioner type" in Table 4 represents the SHADOW® cleaner/conditioner used for a particular test. Cleaner/conditioner I and Cleaner/Conditioner IV are two different commercially available formulations. The "%" figures in Table 4 indicate the proportion of the as-sold cleaner/conditioner used in the bath. The cleaner/conditioner bath was provided with two immersible ultrasonic units; a 25 kHz and a 40 kHz unit. Both units operated at 1000 watts. The ultrasonic transducers were placed 1.25 inches (32 mm) from the bottom of the panel.

The results, tabulated in Table 4, are measured in terms of Total Solder Defects, which include blowholes, partial-fills and no-fills. Table 6 illustrates that a substantial improvement in soldering defects was made by switching to Cleaner/Conditioner IV. However, an additional improvement was made by generating ultrasonic energy in the Cleaner/Conditioner bath during processing. (Compare Example 18 to Examples 19 and 20). When the 25 kHz unit ran alone in Example 26, the defect rate decreased somewhat. However, when the 40 kHz unit ran alone, the ppm defects jumped unexpectedly. The inventors presently have no explanation for the jump. This experiment suggests the use of Cleaner/Conditioner IV with 25 kHz, 1000 watt ultrasonic transducers.

Examples 22–28

In these Examples the effects of putting ultrasonic generators in either or both of the cleaner/conditioner IV bath and the SHADOW® graphite dispersion bath were determined. In these tests SHADOW® cleaner/conditioner IV was used at the recommended dilution as the cleaner conditioner. Shadow® II graphite dispersion was used at the recommended 1:1 dilution. The test apparatus is the dual-frequency arrangement used in Examples 17–21.

The incidence of defects was measured for these examples by using the Hot Oil Test. The Hot Oil Test has been devised to measure the proportion of through holes which release visible gas when immersed in a body of essentially non-volatile liquid held at an elevated temperature substantially exceeding the boiling temperature of water. The gas may be water vapor, air or other gases. The test is carried out much like the hot oil test described and illustrated in F. H. Howie and C. Lea, *Blowholing in PTH Solder Fillets, Part 2, The Nature, Origin and Evolution Of The Gas,* CIRCUIT WORLD, Vol. 12 No. 4 (1986) (see, e.g., FIG. 8 and the accompanying text on that page and the following two pages, particularly notes 3 and 5).

In the present Hot Oil Test, two-inch (5 cm) square coupons, each having 70 plated through holes, were prepared according to the present invention or a control, then electroplated. Each coupon was immersed in a hot oil bath and viewed via a video camera which provided an enlarged image of the coupon on a monitor. The presence or absence of gas bubbles under the test conditions was noted for each through hole. The test was scored by counting the number of outgassing through holes, multiplying that number by 100%/70 holes, and reporting the total as a percent. In the Hot Oil Test, the percentage result reported represents the incidence of defects; a lower result indicates fewer defects, thus better performance.

The results of Examples 22–28 are tabulated in Table 5. First, compare Example 22, where the ultrasonic generator was turned off in the SHADOW® bath, with Examples 22–27, where the ultrasonic generator in the SHADOW® bath was turned on for the indicated periods. Because the ultrasonic generator was on in the cleaner/conditioner bath in Examples 23–27, the hot oil test result yielded few defects, with or without ultrasonic energy in the graphite dispersion. Next, compare Examples 27 and 28, in which the same ultrasonic conditions were maintained in the graphite dispersion bath, while the ultrasonic generator in the cleaner/conditioner was on in Example 27 and off in Example 28. Turning on the ultrasonic energy in the cleaner/conditioner reduced the incidence of defects from 73% to 0%.

Table 5 suggests that the ultrasonic energy is effective in the Cleaner/Conditioner IV, but does not indicate that a further reduction in blowholes would be obtained by also introducing ultrasonic energy in the graphite dispersion. Other examples, however, show that the ultrasonic energy in the graphite dispersion does reduce blowholes and total defects.

Examples 29–34

Examples 29–34 were carried out to evaluate the effect of the amount of time the panels were exposed to ultrasonic energy in a SHADOW® Cleaner/Conditioner IV bath. For this study 2"×2" (5 cm by 5 cm) hot oil test coupons were used. For each example, two coupons supported on wire hooks were processed vertically through a SHADOW® beaker line. The results of the two coupons were separately reported for each example. The cleaner/conditioner bath was SHADOW® cleaner/conditioner IV, at the recommended dilution, in a 1 liter ultrasonic unit model #BL-12, operated at 80 Watts and 40 kHz, at 135° F. (57° C.).

Table 6 shows that the 40 kHz ultrasonic unit was able to improve the hot oil test results. Applying ultrasonic energy for a period between about 30 seconds and one minute during the cleaning/conditioning step improved the hot oil test result; the result was not further improved by applying the ultrasonic energy for a longer time.

Examples 35–39

In Examples 35–39, the concentration of the cleaner/conditioner was varied to determine what effect that might have on the results. SHADOW® Cleaner/Conditioner III was used except in Example 35, where SHADOW® cleaner/conditioner IV was used, as noted in Table 7. The table shows that cleaner/conditioner concentrations of 1% to 30% of the as-sold composition all performed well in the hot oil test, with the best results being achieved at the greatest dilutions of the cleaner/conditioner (1% to 10%). Examples 38 and 39 show that reducing the proportion of solids in the SHADOW® II graphite dispersion to 2%, as in Example 39, detracted from performance in the hot oil test in this instance.

Examples 40–41

Two sets of panels consisting of five laminate types were drilled at three different locations. One set was processed at by one shop without ultrasound in the cleaner. A few months later, after an ultrasound unit was placed in the cleaner, the second set was processed in the same shop. The frequency of the ultrasound used was 25 kHz.

Table 8 demonstrates that the addition of ultrasonic energy dramatically reduced the incidence of blowholes—from 12,069 ppm to 319 ppm. In this instance, other defects were reduced as well, but not proportionately to the reduction in blowholes.

Examples 42–46

In these Examples, dual frequency ultrasonic process equipment substantially like that of Examples 17–21 was used. Two different commercial SHADOW® cleaner/conditioner formulations (I and IV), each diluted to 20%, were evaluated. Table 9 tabulates the results. Examples 42 and 43 demonstrate that SHADOW® cleaner/conditioner IV itself provided many fewer blowholes and other defects than SHADOW® cleaner/conditioner I. Examples 43 and 44–45 again show that the introduction of ultrasonic energy in the cleaner/conditioner makes a further, substantial reduction in the incidence of blowholes and other defects, with a dual frequency ultrasonic arrangement providing the best results. Again, however, the 40 kHz ultrasound source, operated alone, was not effective in this instance to reduce blowholes or other defects.

Examples 47–49

Table 10 shows further results of carrying out the present process using 25 kHz ultrasonic generators in the SHADOW® Cleaner/conditioner and graphite dispersion baths.

First, compare Examples 47 and 48. Employing ultrasound in the SHADOW graphite dispersion in Example 48 reduced both the incidence of blowholes and other defects, versus Example 47 which was carried out without ultrasound in the graphite dispersion.

Now compare Examples 47 and 49, which differ in that ultrasound is used in the cleaner/conditioner in Example 47, but not in Example 49. Here, no benefit was observed in the number of blowholes, but some benefit was observed in the number of other defects. In this particular experiment, therefore, ultrasonic energy in the graphite dispersion was the more decisive factor reducing the number of blowholes and other defects.

In summary, the present invention is practiced by treating any one or more of a cleaner, a conditioner, a cleaner/conditioner, and a conductive carbon coating composition, using an ultrasonic generator or equivalent means, when or shortly before the composition is applied to a non-conductive substrate.

The present invention allows one to deposit a more controlled and uniform coating of conductive carbon particles than before on the non-conductive surface of a through hole. This carbon coating can be electroplated, and the resulting electroplating will be unexpectedly better than the electroplating deposited on a carbon coating which is not subjected to ultrasonic energy before or while it is applied. The present invention also allows one to avoid the formation of blowholes and other soldering defects later in the processing of the printed wiring boards when they are exposed to solder.

TABLE 1

| Example: | 1 | 2 | 3 | 4 |
|---|---|---|---|---|
| Original Ultrasonic time (minutes) | 0 | 5 | 15 | 15[1] |
| Delay After Original Ultrasound (days) | 0 | 0 | 0 | 0 |
| Plating time (minutes) | 10 | 10 | 10 | 10 |
| Backlight score (scale: 1–10) | 6.5 | 9.5 | 10.0 | 9.5 |
| # of pinholes/hole (average) | 40 | 5.6 | 0 | 2.8 |
| # of small patches/hole (average) | 7 | 0 | 0 | 0.2 |
| # of medium patches/hole (average) | 0 | 0 | 0 | 0 |

[1]For example 4 the graphite dispersion was treated with ultrasonic waves at its as-sold concentration, then diluted to its working concentration.

TABLE 2

| Ex. | # of panels | Holes/Panel | Ultrasound | Blowholes (ppm) | Total defects (ppm) |
|---|---|---|---|---|---|
| 5 | 10 | 1600 | yes | 688 | 8313 |
| 6 | 4 | 600 | yes | 0 | — |
| 7 | 11 | 2400 | yes | 0 | 0 |
| 8 | 6 | 2400 | no | 1042 | high |
| 9 | 5 | 200 | yes | 0 | 0 |
| 10 | 2 | 700 | yes | 0 | 0 |
| 11 | 5 | 2400 | yes | 0 | 0 |

TABLE 3

| Ex. | Ultrasound | Blowholes (ppm) | Other Defects (ppm) | Thickness mils (microns) |
|---|---|---|---|---|
| 12 | yes | 3500 | 91,000 | 2.1 (53) |
| 13 | yes | 2000 | 116,625 | 1.5 (38) |
| 14 | no | 12625 | 335,500 | 1.8 (46) |
| 15 | no | 9000 | 92,500 | 2.4 (61) |
| 16 | yes* | 875 | 20,625 | 1.8 (46) |

*on this test one of the two air hoses was removed from the air knife after Shadow ®

TABLE 4

| # | Cleaner/Conditioner Type | Ultrasonics | Total Solder Defects |
|---|---|---|---|
| 17 | I at 20% | None | 43,358 ppm |
| 18 | IV at 20% | None | 6,146 ppm |
| 19 | IV at 20% | 25 and 40 kHz | 660 ppm |
| 20 | IV at 20% | 25 kHz | 1,075 ppm |
| 21 | IV at 20% | 40 kHz | 26,072 ppm |

TABLE 5

| # | Ultrasonic in Cleaner/Conditioner IV | Ultrasonic in Shadow ® On/Off | Hot Oil Test |
|---|---|---|---|
| 22 | 1.5 minutes | Off | 4% 3% |
| 23 | 1.5 minutes | 30 seconds on 3 minutes off | 1.5% 4% |
| 24 | 1.5 minutes | 1 hour on before test, 30 seconds on during the test, 3 minutes off | 0% 0% |
| 25 | 1.5 minutes | 5 hours on before test, 30 seconds on during the test, 3 minutes off | 1.5% 3% |
| 26 | 1.5 minutes | 5 hours on before test, 3 minutes on during the test | 1.5% 1.5% |
| 27 | 1.5 minutes | 5 hours on before test, off during the test | 0% 0% |
| 28 | Off | 5 hours on before test, Off during the test | 70% 73% |

TABLE 6

| Test Number | Ultrasonic Time in Cleaner/Conditioner IV | Hot Oil Test |
|---|---|---|
| 29 | 0 | 20% 15% |
| 30 | 30 seconds | 6% 8% |
| 31 | 1 minute | 1.5% 0% |
| 32 | 2 minutes | 3% 1.5% |
| 33 | 3 minutes | 0% 3% |
| 34 | 6 minutes | 1.5% 0% |

TABLE 7

| Test No. | Formula | Hot Oil Test |
|---|---|---|
| 35 | 1%* | 0% 0% |
| 36 | 5% | 0% 0% |
| 37 | 10% | 0% 0% |
| 38 | 30% | 1.5% 1.5% |
| 39 | 30% But Shadow ® II = 2% Solids | 3% 3% |

*SHADOW ® cleaner/conditioner III was used in this instance

TABLE 8

| Ex. | Ultrasound? | Blowholes (ppm) | Other Defects (ppm) |
|---|---|---|---|
| 40 | no | 12069 | 56944 |
| 41 | yes | 319 | 20444 |

TABLE 9

| Ex. | Cleaner | Ultrasound | Blowholes (ppm) | Other Defects (ppm) |
|---|---|---|---|---|
| 42 | C/C I | none | 32879 | 10479 |
| 43 | C/C IV | none | 3960 | 2186 |
| 44 | C/C IV | 25 kHz and 40 kHz | 495 | 165 |
| 45 | C/C IV | 25 kHz | 907 | 168 |
| 46 | C/C IV | 40 kHz | 17739 | 8333 |

TABLE 10

| Ex. | Ultrasound in Cleaner? | Ultrasound in Shadow ® | Blowholes (ppm) | Other Defects (ppm) |
|---|---|---|---|---|
| 47 | yes | no | 625 | 5000 |
| 48 | yes | yes | 156 | 2812 |
| 49 | no | no | 625 | 8125 |

We claim:

1. A method for applying a particulate conductive carbon coating to a non-conductive through hole surface of a printed wiring board, comprising the steps of:
   A. providing a printed wiring board including at least one through hole;
   B. providing at least one carbon bath containing a dispersion of undissolved particulate conductive carbon for coating said through hole;
   C. providing at least one conditioning bath containing a dispersion which is useful for conditioning said through hole for the application of a particulate conductive carbon coating from said carbon bath; and
   D. at least partially immersing said through hole in said conditioning bath and said carbon bath under conditions effective to deposit an electrically conductive carbon coating on said through hole; and
   E. introducing ultrasonic energy in at least one of said conditioning bath and said carbon bath during said immersing step by placing an ultrasonic generator in said at least one bath, under conditions effective to at least reduce the formation of blowholes during later processing of the printed wiring board.

2. The method of claim 1, wherein said conditioning bath is a through hole cleaning and conditioning composition.

3. The method of claim 1, wherein said carbon bath is an aqueous dispersion.

4. The method of claim 3, wherein said carbon bath is a carbon black dispersion.

5. The method of claim 3, wherein said carbon bath is a graphite dispersion.

6. The method of claim 1, wherein said ultrasonic generator generates ultrasonic waves having a frequency between about 16 kHz and about 100 kHz.

7. The method of claim 1, wherein said ultrasonic generator generates ultrasonic waves having a frequency between about 20 kHz and about 50 kHz.

8. The method of claim 1, wherein said ultrasonic generator generates ultrasonic waves having a frequency between about 25 kHz and about 40 kHz.

9. The method of claim 1, wherein said printed wiring board has a first major surface perforated by a multiplicity of through holes extending into said major surface.

10. The method of claim 9, comprising the further step of conveying said printed wiring board in contact with at least one of said carbon bath and said conditioning bath along a path extending substantially parallel to said first major surface.

11. The method of claim 10, wherein the step of introducing ultrasonic energy is carried out by placing an ultrasonic generator in said at least one bath.

12. The method of claim 11, wherein at least an operative portion of said ultrasonic generator is immersed in said at least one bath.

13. The method of claim 12, wherein said ultrasonic generator is completely immersed in said at least one bath.

14. The method of claim 12 wherein at least an operative portion of said ultrasonic generator is immersed in said at least one bath below said path.

15. The method of claim 12, wherein said ultrasonic generator is completely immersed in said at least one bath below said path.

16. The method of claim 10, wherein said ultrasonic generator is sized and positioned, relative to said path, to provide ultrasonic energy at substantially each part of said major surface including a through hole requiring electroplating.

17. The method of claim 10, wherein said ultrasonic generator is positioned less than about two inches from said path.

18. The method of claim 10, wherein said ultrasonic generator is positioned about one inch from said path.

19. The method of claim 18, wherein said ultrasonic generator is positioned about 1.3 inches from said path.

20. The method of claim 19, wherein said ultrasonic generator is positioned about 1.25 inches from said path.

21. The method of claim 1, comprising the further steps of:
   A. providing at least one other bath which is useful for cleaning said through hole; and
   B. immersing at least part of said through hole in said at least one other bath.

22. The method of claim 1, wherein said ultrasonic energy is introduced into at least one of said carbon bath and said conditioning bath before immersing said printed wiring board in that bath.

23. The method of claim 1, wherein said ultrasonic energy is introduced before the end of said immersing step.

24. The method of claim 1, wherein said ultrasonic energy is introduced before and during said immersing step.

25. The method of claim 1, wherein ultrasonic energy is introduced in said conditioning bath.

26. The method of claim 1, wherein ultrasonic energy is introduced in said carbon bath.

27. The method of claim 1, wherein ultrasonic energy is introduced in said carbon bath and in said conditioning bath.

* * * * *